US006381066B1

(12) United States Patent
Korn et al.

(10) Patent No.: US 6,381,066 B1
(45) Date of Patent: Apr. 30, 2002

(54) INTEGRATED SEMICONDUCTOR OPTICAL AMPLIFIER SYSTEM

(75) Inventors: Jeffrey A. Korn; Dale C. Flanders; Peter S. Whitney, all of Lexington, MA (US)

(73) Assignee: Axsun Technologies, Inc., Billerica, MA (US)

( * ) Notice: Subject to any disclaimer, the term of this patent is extended or adjusted under 35 U.S.C. 154(b) by 6 days.

(21) Appl. No.: 09/675,332

(22) Filed: Sep. 28, 2000

(51) Int. Cl.$^7$ ................................................. H01S 5/50
(52) U.S. Cl. ....................................................... 359/344
(58) Field of Search ............................ 359/344, 43, 44, 359/45, 46; 372/47, 48, 49, 50

(56) References Cited

U.S. PATENT DOCUMENTS

| | | | | |
|---|---|---|---|---|
| 4,944,569 A | * | 7/1990 | Boudreau et al. | 350/96.2 |
| 5,128,956 A | * | 7/1992 | Aoki et al. | 372/703 |
| 5,703,893 A | * | 12/1997 | Komiyama et al. | 372/43 |
| 5,740,293 A | | 4/1998 | Van Roemburg et al. | 385/92 |
| 5,812,715 A | | 9/1998 | Tiemeijer et al. | 385/73 |
| 6,178,188 B1 | * | 1/2001 | Jing et al. | 372/36 |
| 6,192,058 B1 | * | 2/2001 | Abeles | 372/6 |
| 6,220,765 B1 | * | 4/2001 | Tatoh | 385/94 |
| 6,310,717 B1 | * | 10/2001 | Naganuma et al. | 359/341.1 |

FOREIGN PATENT DOCUMENTS

WO  00/36720  6/2000  ............. H01S/5/50

OTHER PUBLICATIONS

Kato, Tomoaki; Sasaki, Jun–ichi; Shimoda, Tsuyoshi; Hatakeyama, Hiroshi; Tamanuki, Takemasa; Kitamura, Shotaro; Yamaguchi, Masayuki; Sasaki, Tatsuya; Komatsu, Keiro; Kitamura, Mitsuhiro; Itoh, Masataka, "Hybrid Integrated 4×4 Optical Matrix Switch Module on Silica Based Planar Waveguide Platform," IEICE Trans. Electron. vol. E82–C, No.2 Feb., 1999, pp. 305–312.

Park, M.W.; Kim, J.R.; Lee, J.S.; Kim, H.I.; Choo, A.G.; Kim, T.I., "Lens–less Semiconductor Optical Amplifier (SOA) Modules Using Laser Welding Techniques." http://ectc.net/advance—program/abstracts2000/s37p03.html.

Semiconductor Optical Amplifier Chip for 1300 nm Wavelength Window–SOA1300CRI. http://www.optospeed.ch/components/soa1300cri.htm.

* cited by examiner

Primary Examiner—Thomas H. Tarcza
Assistant Examiner—DeAndra Hughes
(74) Attorney, Agent, or Firm—Grant Houston

(57) ABSTRACT

A semiconductor optical amplifier system comprises a hermetic package. In the typical implementation, this hermetic package is a standard 0.75 inch×0.5 inch package, such as a butterfly package. An optical bench is sealed within this package. A first fiber pigtail enters this package via a feed-through to connect to the bench and terminate above the bench. A second optical fiber pigtail enters the package via a second fiber feed-through to connect to the bench and similarly, terminate above the bench. A semiconductor amplifier chip is connected to the bench to provide amplification. Isolators are further incorporated along with a monitoring diode to yield a fully integrated system.

12 Claims, 4 Drawing Sheets

INTEGRATED SEMICONDUCTOR OPTICAL AMPLIFIER SYSTEM

BACKGROUND OF THE INVENTION

Today, the most common modality for optical signal amplification is the rare-earth doped fiber amplifier. These devices have good amplification characteristics and a well-understood long-term behavior. Moreover, they can be inserted into a fiber link via fiber splicing, which is a low loss coupling technique.

An alternative amplification modality is the semiconductor optical amplifier (SOA). SOA systems have a number of advantages relative to the common erbium-doped amplifier scheme. SOA's are typically electrically, rather than optically, pumped. As a result, they are more efficient and avoid the need for ancillary, expensive laser pumps. Moreover, they are usually physically smaller than fiber amplifiers, which require a relatively long length of doped fiber. This quality is especially relevant when amplification is required in larger systems offering higher levels of functionality, such as optical add-drop multiplexers and other types of switching devices. The semiconductor optical amplifier can be as small as the semiconductor chip.

Nonetheless, the principal barrier to the commercial deployment of semiconductor optical amplifiers is the difficulty associated with coupling optical signals in and out of the semiconductor amplifier chip. The coupling issues are analogous to coupling light from a laser transmitter/laser pump into an optical fiber with the additional problems associated with back-reflection suppression, which can convert the amplifier into a laser, resulting in unintended operation.

SUMMARY OF THE INVENTION

The present invention concerns a semiconductor optical amplifier system and specifically, the implementation of a semiconductor optical amplifier system on a single substrate or optical bench. As such, the present invention is applicable to the inclusion of a physically-compact amplification system into larger optical systems.

When constructing semiconductor optical amplifiers, it is typically desirable to have some type of feedback mechanism to control the amplification level of the semiconductor optical amplifier. Proposed techniques for diverting a portion of the optical signal from the amplifier chip, however, can be susceptible to polarization shifts in the optical signal. As a result, they can introduce some noise into the feedback scheme.

In general, according to one aspect, the present invention features a semiconductor optical amplifier system. It comprises a hermetic package. In the typical implementation, this hermetic package is a standard 0.75 inch×0.5 inch package, such as a butterfly package. An optical bench is sealed within this package. A first fiber pigtail enters this package via a feed-through to connect to and terminate above the bench. A second optical fiber pigtail enters the package via a second fiber feed-through to connect to and similarly terminate above the bench. A semiconductor amplifier chip is connected to or installed on the bench.

In a preferred embodiment, at least one isolator is included in the hermetic package and specifically on the optical bench for suppressing back-reflections into the fiber pigtail and/or the semiconductor optical amplifier chip. Specifically, in the preferred embodiment, a first isolator suppresses back-reflections into the input or first fiber pigtail and a second isolator suppresses back-reflections into the semiconductor optical amplifier chip.

In the preferred embodiment, additional optical components are provided to facilitate the transmission of optical signals through the system. Specifically, a first collimation lens is installed on the bench between the first isolator and the termination of the first fiber pigtail to improve the collimation of light emitted from the first fiber pigtail. A focusing lens is installed on the bench between the first isolator and the semiconductor optical amplifier chip to couple light from the first isolator into the semiconductor optical amplifier chip. Further, a second collimation lens is installed between the second isolator and the chip to couple light from the chip into the second isolator. Finally, a second focusing lens is installed on the bench for coupling light from the second isolator into the second pigtail.

Although, in the preferred embodiment, discrete optics are used to couple light into and out of the fiber pigtails, in alternative embodiments, fiber lenses may be formed on the fiber endfaces to reduce or eliminate the need for discrete coupling optics between the fiber endfaces and the other components of the system.

According to another embodiment, in a single physical port embodiment, the optical signal is received into the hermetic package by a fiber, focused onto the amplifier chip, reflected to pass back through the chip, and then refocused onto the fiber so that the amplified optical signal exits from the system.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1A:
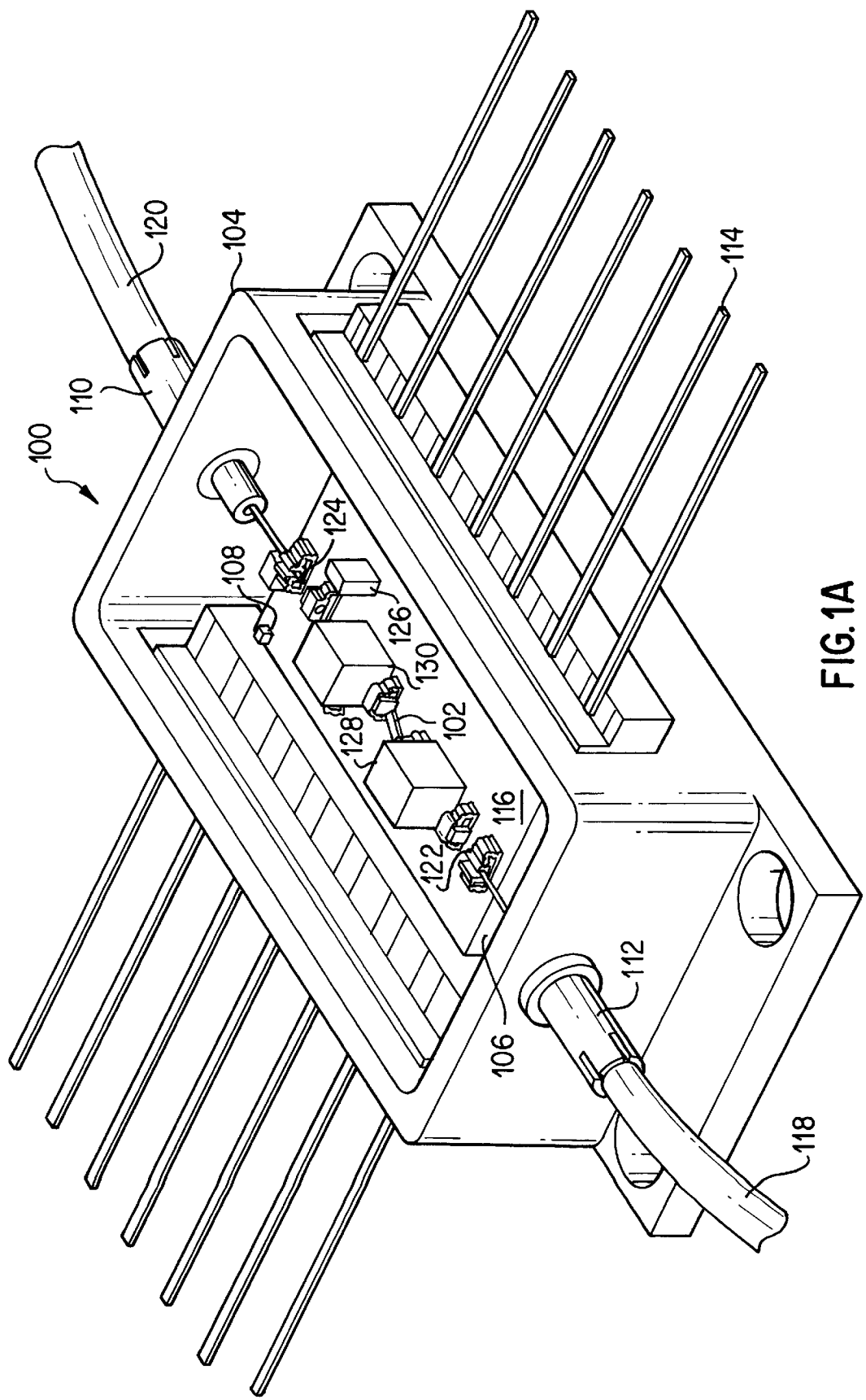
FIG. 1A is a perspective view of a semiconductor optical amplifier system according to the present invention.

FIG. 1A shows a semiconductor optical amplifier system (SOA), which has been constructed according to the principles of the present invention.

Generally, the SOA 100 comprises a hermetic module or package 104. In the illustrated example, the package 104 is a butterfly package with leads 114. In the view of FIG. 1A, the top of the hermetic module 104 has been removed.

The hermetic package 104 has an input fiber feed-through to which an input fiber ferrule 112 is attached. An input optical fiber pigtail 118 enters into the hermetic package 104 via the input fiber feedthrough.

The hermetic package 104 also has an output fiber feedthrough in which an output fiber ferrule 110 is installed. The output fiber pigtail 120 passes through the hermetic package 104 exiting from the module.

Within the hermetic module 104, an optical substrate or bench 116 is installed. In the typical implementation, the optical bench 116 is installed on a thermoelectric cooler 106. A thermocouple 108 is typically attached to the top of the bench 116 to detect the temperature within the module 104 to enable the temperature stabilization.

Figure 1B:
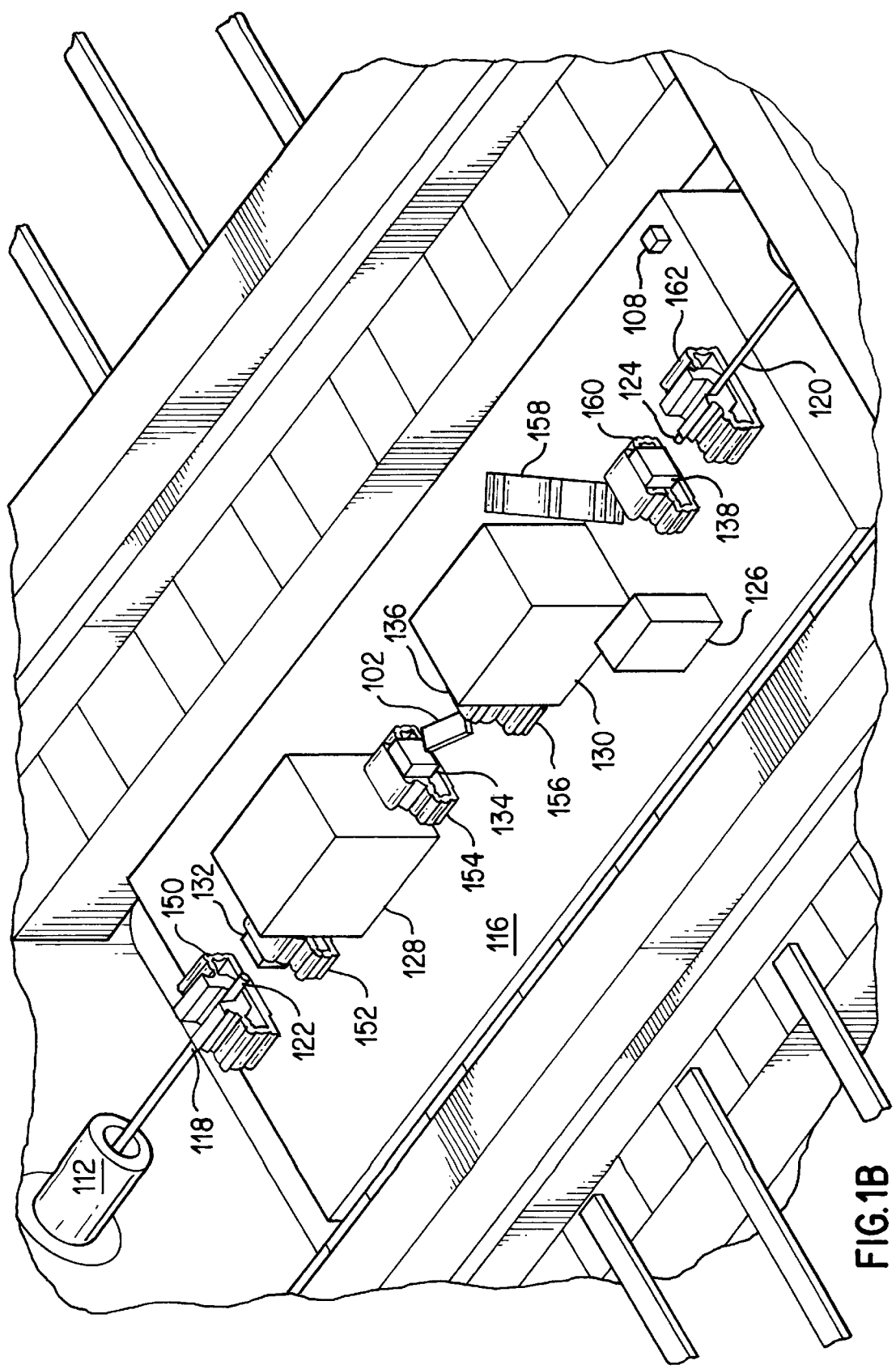
FIG. 1B is a close-up view of the inventive semiconductor optical amplifier system.

FIG. 1B is a close-up view, better illustrating the configuration of components on the optical bench 116.

Specifically, the input optical fiber 118 passes through the ferrule 112 and is secured to the bench 116 via a fiber mounting structure 150. This structure secures the fiber endface or optical signal source 122 such that it is terminated above the optical bench 116.

The diverging input beam that is emitted from the fiber endface 122 is collimated or has its collimation improved via a first collimating lens 132, which is supported above the substrate on an optical component mounting structure 152. This first collimating lens 132 generates a generally cylindrical, but diffracting input signal beam, which enters a first isolator 128. The first isolator prevents back reflections into the optical signal input port/fiber endface 122.

The optical signal after exiting the first isolator is focused by a first focusing lens 134, which is supported above the substrate on a second optical component mounting structure 154. Specifically, the optical signal is focused and thus coupled into a semiconductor optical amplifier chip 102.

The optical signal is amplified in the semiconductor optical amplifier chip 102. Typically, these amplifier chips are constructed from AlGaAs substrates with ridge waveguide structures. The invention, however, is of course applicable to chips made with other material systems/chip configurations.

The amplified optical signal is emitted from the chip 102 in a typically diverging beam. A second collimating lens 136, which is supported above the bench 116 on a third optical component mounting structure 156, generates a collimated diffracting beam.

Figure 3:
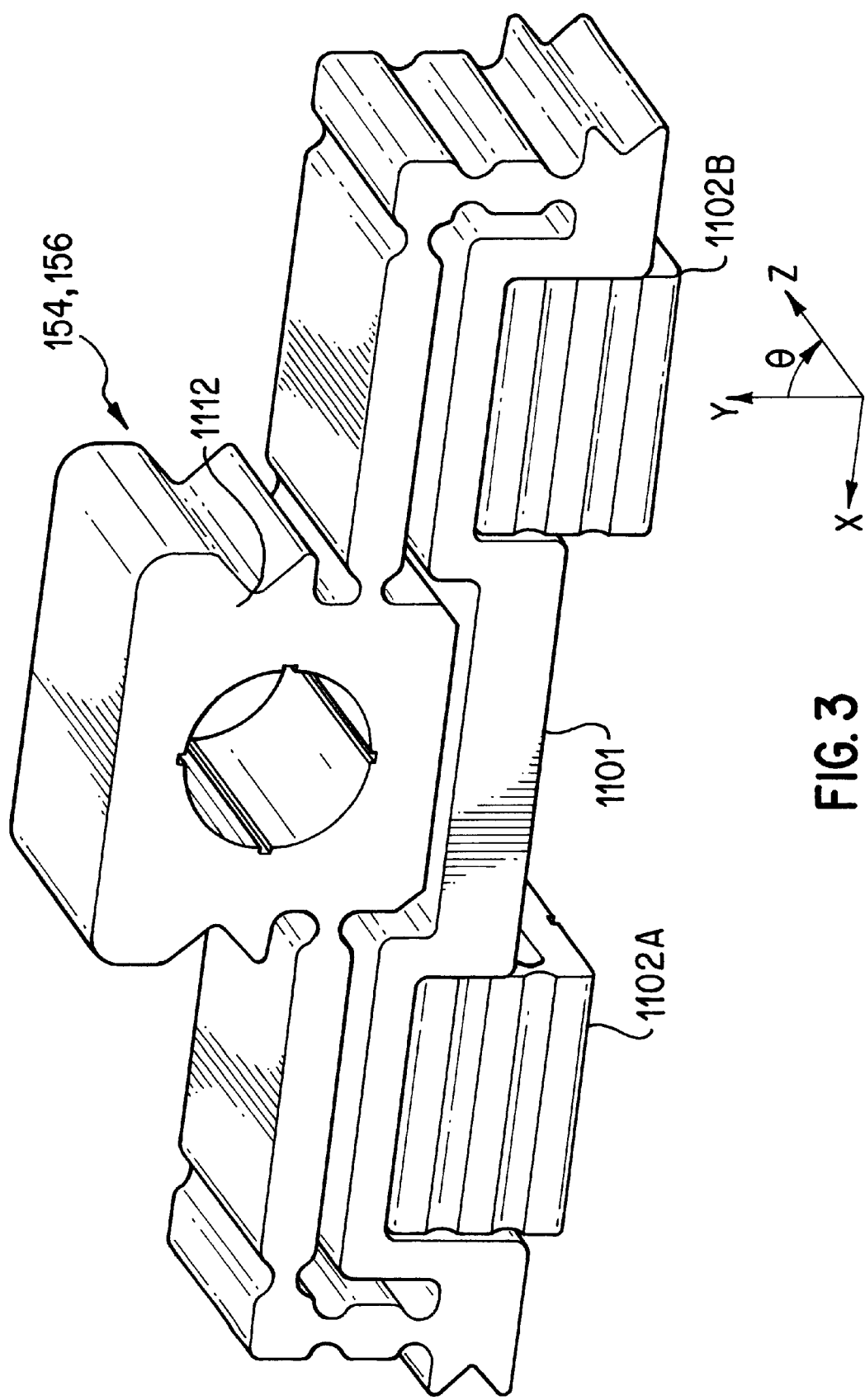
FIG. 3 is a perspective view showing a composite mounting structure used to hold lenses 134, 136 to provide for z-axis alignment.

In the preferred embodiment, the mounting structures 154 and 156 are preferably composite structures that allow for alignments in the x- and y-axes, but also the z-axis as illustrated in FIG. 3. Specifically, two z-axis flexure pieces 1102A, 1102B are used to control rotation around the x-axis or in the direction of angle $\Theta_x$, thereby determining the resistance to force components along the z-axis. Preferably, the z-axis flexure pieces 1102 are separately fabricated and bonded to base surface of portion 1101. Base surfaces of the pieces 1102 are then bonded to the bench 116 with the lens bonded to optical element interface 1112. As a result, the z-axis position of the focal point of the lens can be controlled relative to the SOA chip facets.

Returning to FIG. 1B, the amplified optical signal beam then passes through a second isolator 130 for preventing back-reflections into the chip 102. The beam of the amplified optical signal, which exits from the second isolator 130, is focused by a second focusing lens 138, which is supported above the substrate on a fourth optical component mounting structure 160, and coupled into an output port or the endface 124 of the output fiber pigtail 120. The termination of the output fiber is supported above the substrate 116, via a second fiber mounting structure 162.

In this way, the SOA system is integrated on a common substrate with isolation. This implementation allows for the addition of amplification capabilities in a very compact form-factor, which is applicable not only to general amplification applications but also as a subsystem in larger optical systems providing higher levels of functionality.

In the preferred embodiment, a photodetector is additionally integrated within the SOA system 100. Specifically, a photodetector 126 is installed in the bench 116 to detect the power of the amplified optical signal. Preferably, this signal is used as a feedback control signal to regulate the level of electrical-drive being provided to the semiconductor optical amplifier chip 102.

According to the preferred embodiment, a polarization independent scheme is used to detect the strength of the amplified optical signal. Specifically, a reflecting component is inserted into the beam path of the amplified optical signal to reflect a portion of this optical signal to a photodetector 126. In the preferred embodiment, a small portion of the cross-section of the amplified optical signal beam is scattered. This has advantages relative to half mirrors, for example, that are installed across the entire beam path since the reflectivity of such devices is typically very polarization dependent.

In the preferred embodiment, a mounting structure 158 is inserted to nick an outer cross-sectional portion of beam of the amplified optical signal to scatter a portion of the amplified optical signal to be detected by the photodetector 126. In alternative embodiments, the portion of the amplified optical signal can be specularly reflected to the photodetector 126.

According to one manufacturing technique, the optical signal link or path through the system 100 is activated and the mounting structure is placed or deformed into the beam path such that it interrupts less than 5% of the beam's power, and specifically less than 1% in the preferred embodiment.

Figure 2:
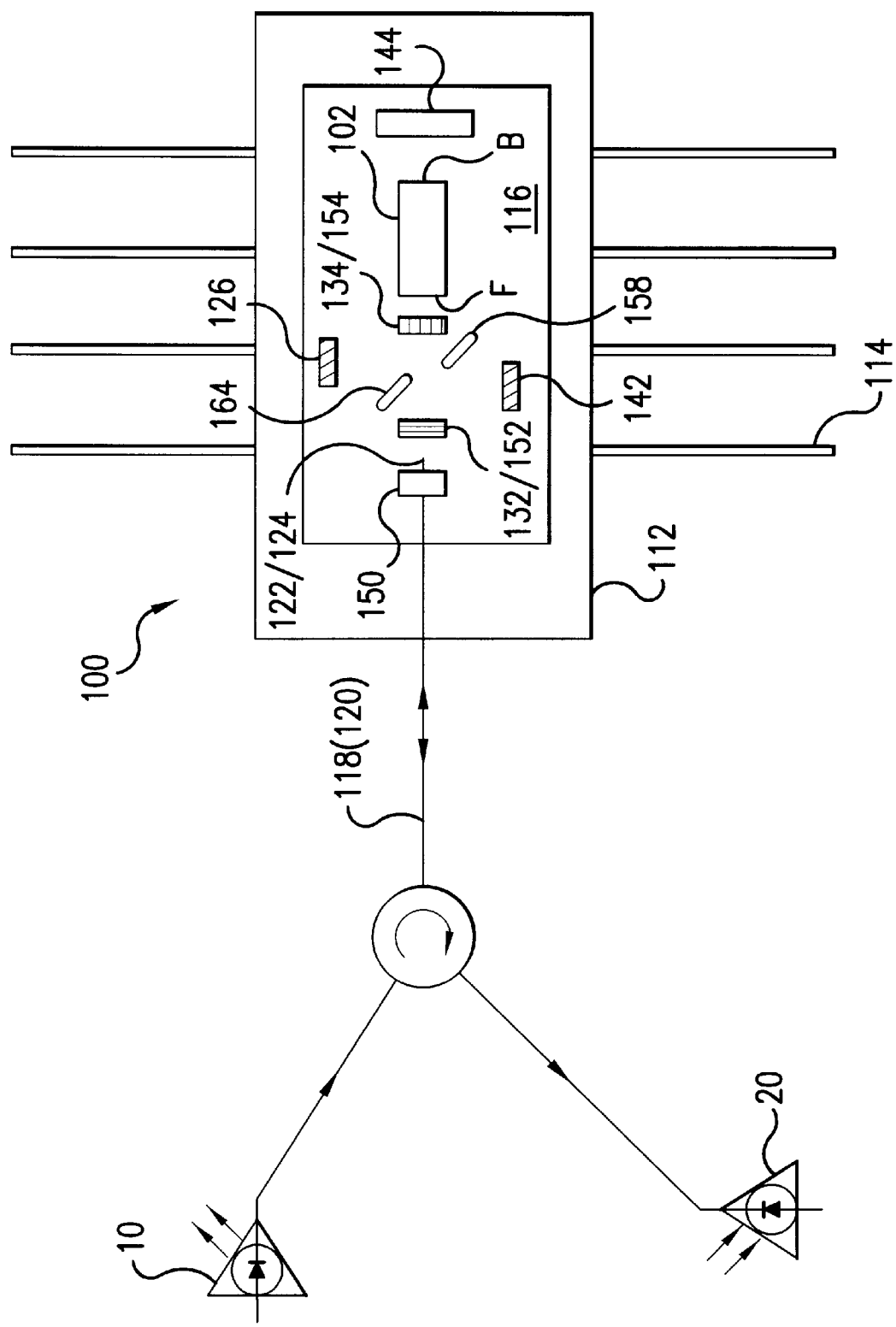
FIG. 2 is a block/schematic view of a second embodiment of the semiconductor optical amplifier system of the present invention.

FIG. 2 illustrates a second embodiment of an SOA system 100, which has been constructed according to the principles of the present invention.

Specifically, a wavelength division multiplex (WDM) signal source 10 generates the input optical signal to be amplified. This signal is received by a circulator 30, in one embodiment, which circulator passes the optical signal to the SOA system 100. Alternatively other coupling systems can be used.

As described previously, the optical fiber passes into the hermetic package 112 via a fiber feedthrough and is terminated above the optical bench 116. Specifically, the endface is held above the optical bench 116 via a fiber mounting structure 150.

This embodiment is a single physical-fiber port design. Specifically, only a single fiber passes into the module 112. As a result, fiber 118 functions both the input fiber and output fiber. Additionally, the fiber endface functions both as the optical signal input port 122 and the output port 124 for the amplified optical signal.

Specifically, the diverging beam from the fiber endface or input port 122 is collimated by a collimating lens 132. As described previously relative to FIG. 1B, the lens is held on an optical component mounting structure 152 on the bench 116.

The optical signal beam is then focused by a focusing lens 134 (held on an optical component mounting structure 154) onto the semiconductor optical amplifier chip 102.

The optical signal is amplified in the chip. The partially amplified optical signal having made one pass through the chip is then reflected to pass through the chip 102 a second time. This double pass arrangement can be accomplished by reflectively coating the back facet B of the chip 102. In an alternative embodiment, a discrete reflector 144 is located behind the back facet B of chip 102. This reflects the light to re-enter the chip 102. In one implementation of this discrete reflector configuration, the reflector 144 has a concave shape to refocus the beam onto the back facet B of the chip 102. In alternative embodiments, additional focusing optics can be installed in the beam path between the back facet B and the reflecting structure 144.

The fully amplified optical signal is emitted from the front facet F of chip 102 on the second pass. It is emitted as a diverging beam and is collimated by the focusing lens 134. The amplified optical signal passes from the focusing lens 134 to the collimation lens 132, which now functions as a focusing lens to couple the amplified optical signal into the fiber 118 via focusing it onto the endface 122/124. The amplified optical signal now passes through the fiber 118 now functioning as the output fiber 120 to circulator 130 to be directed to the WDM photodetector 20.

The embodiment of FIG. 2 has provisions for detecting the amplitude of both of the input optical signal and the amplified optical signal. Specifically, an input photodetector 142 detects the level of the input optical signal. Output photodetector 126 detects the level of the amplified optical signal.

Specifically, reflective structures 158, 164 are inserted into the beam paths of both the input optical signal and the amplified optical signal. Specifically, structure 164 specularly reflects or scatters the input optical signal to be detected by photodetector 142. Structure 158 specularly reflects or scatters light to be detected by the output signal detector 126. As a result, the second embodiment is capable of modulating the level by which the chip 102 is energized based upon and in response to both the level of the input optical signal and the level of the amplified optical signal.

While this invention has been particularly shown and described with references to preferred embodiments thereof, it will be understood by those skilled in the art that various changes in form and details may be made therein without departing from the scope of the invention encompassed by the appended claims.

What is claimed is:

1. A semiconductor optical amplifier system, comprising:
    a package;
    an optical bench within the package;
    a first fiber pigtail entering the package to connect to the bench and terminate above the bench to supply an input optical signal;
    a second fiber pigtail entering the package to connect to the bench and terminate above the bench to receive an amplified optical signal;
    a semiconductor optical amplifier chip connected to the bench that converts the input optical signal into the amplified optical signal;
    a first isolator installed on the bench between a termination of the first fiber pigtail and the semiconductor optical amplifier chip for suppressing back-reflections;
    a first lens installed on the bench between the first isolator and a termination of the first fiber pigtail for improving the collimation of light emitted from the termination of the first fiber pigtail;
    a second lens installed on the bench between the first isolator and the semiconductor optical amplifier chip for coupling light being emitted from the first isolator into the semiconductor optical amplifier chip;
    a second isolator installed on the bench between a termination of the second fiber pigtail and the semiconductor optical amplifier chip for suppressing back-reflections;
    a third lens installed on the bench between the second isolator and the semiconductor optical amplifier chip for coupling light that is emitted from the semiconductor optical amplifier chip into the second isolator; and
    a fourth lens installed on the bench for coupling light exiting from the second isolator into the second fiber pigtail.

2. A semiconductor optical amplifier system as claimed in claim 1, wherein the package is hermetic.

3. A semiconductor optical amplifier system as claimed in claim 1, wherein the package comprises fiber feed throughs through which the first fiber pigtail and the second fiber pigtail pass.

4. A semiconductor optical amplifier system as claimed in claim 1, further comprising a fiber mounting structure for attaching the termination of the first fiber pigtail in proximity to the first lens on the bench.

5. A semiconductor optical amplifier system as claimed in claim 4, further comprising another fiber mounting structure for attaching the termination of the second fiber pigtail in proximity to the fourth lens on the bench.

6. A semiconductor optical amplifier system as claimed in claim 1, further comprising:
    a first fiber mounting structure for attaching the termination of the first fiber pigtail to the bench; and
    a second fiber mounting structure for attaching the termination of the second fiber pigtail to the bench.

7. A semiconductor optical amplifier system as claimed in claim 1, wherein the optical bench is smaller than 0.75 inches by 0.5 inches.

8. A semiconductor optical amplifier system, comprising:
    a hermetic package;
    an optical bench sealed within the package;
    a fiber pigtail entering the package via a first fiber feed-through to connect to the bench and terminate above the bench to supply an input optical signal a and receive an amplified output optical signal; and
    a semiconductor optical amplifier chip connected to the bench that converts the input optical signal to the amplified optical signal; and
    a reflector for double-passing the optical signal through the semiconductor optical amplifier chip.

9. A semiconductor optical amplifier system as claimed in claim 8, further comprising:
    a first lens installed on the bench between a termination of the fiber pigtail and the semiconductor optical amplifier chip; and
    a second lens installed between the first lens and the semiconductor optical amplifier chip.

10. A semiconductor optical amplifier system as claimed in claim 8, further comprising a fiber mounting structure for attaching a termination of the fiber pigtail to the bench.

11. A semiconductor optical amplifier system as claimed in claim 8, wherein the optical bench is smaller than 0.75 inches by 0.5 inches.

12. A semiconductor optical amplifier system, comprising:
    a semiconductor optical amplifier chip that converts an input optical signal into an amplified optical signal;

a first isolator for suppressing back-reflections from the input optical signal;

a first lens for guiding the input optical signal to pass through the first isolator;

a second lens between the first isolator and the semiconductor optical amplifier chip for coupling light being emitted from the first isolator into the semiconductor optical amplifier chip;

a second isolator for suppressing back-reflections from the amplified optical signal;

a third lens between the second isolator and the semiconductor optical amplifier chip for guiding the amplified optical signal to pass through the second isolator; and a fourth lens for coupling light exiting from the second isolator into an output port.

* * * * *